United States Patent [19]
Takayama et al.

[11] Patent Number: 5,982,345
[45] Date of Patent: Nov. 9, 1999

[54] ORGANIC ELECTROLUMINESCENT IMAGE DISPLAY DEVICE

[75] Inventors: Ichiro Takayama, Kanagawa; Michio Arai, Tokyo, both of Japan

[73] Assignee: TDK Corporation, Kanagawa, Japan

[21] Appl. No.: 08/797,656

[22] Filed: Jan. 31, 1997

[30] Foreign Application Priority Data

Feb. 9, 1996 [JP] Japan .................................. 8-023710

[51] Int. Cl.$^6$ ....................................................... G09G 3/30
[52] U.S. Cl. ................................................. 345/76; 345/82
[58] Field of Search ........................ 345/76, 77, 60, 345/65, 74, 83, 208, 91, 87, 93; 313/336, 351, 506, 511, 513, 504, 500; 315/150; 564/309, 50

[56] References Cited

U.S. PATENT DOCUMENTS

| | | | |
|---|---|---|---|
| 3,792,308 | 2/1974 | Ota | 315/150 |
| 3,793,628 | 2/1974 | Gaur | 345/76 |
| 3,875,442 | 4/1975 | Wasa et al. | 345/76 |
| 4,755,807 | 7/1988 | Guennou | 345/83 |
| 5,276,380 | 1/1994 | Tang | 345/76 |
| 5,644,190 | 7/1997 | Potter | 313/351 |

OTHER PUBLICATIONS

"A 6×6–in 20–lpi Electroluminescent Display Panel", Brody et al, *IEEE Transactions on Electron Devices*, vol. ED–22, No. 9, Sep. 1975, pp. 739–748.

*Nikkei Electronics*, Sep. 26, 1994, pp. 179–191.

*Primary Examiner*—Steven J. Saras
*Assistant Examiner*—John Suraci
*Attorney, Agent, or Firm*—Nikaido Marmelstein Murray & Oram LLP

[57] ABSTRACT

An image display system having a plurality of light emitting cells ($EL_{11}$–$EL_{44}$) each having a pair of Electro-Luminescence elements ($e_1$, $e_2$) coupled in parallel with each other with opposite polarities. The light emitting cells are arranged on a cross point of a matrix, which is addressed through an active addressing method in which a plurality of rows of the matrix are selected simultaneously, and alternate voltage is applied to the matrix.

5 Claims, 6 Drawing Sheets

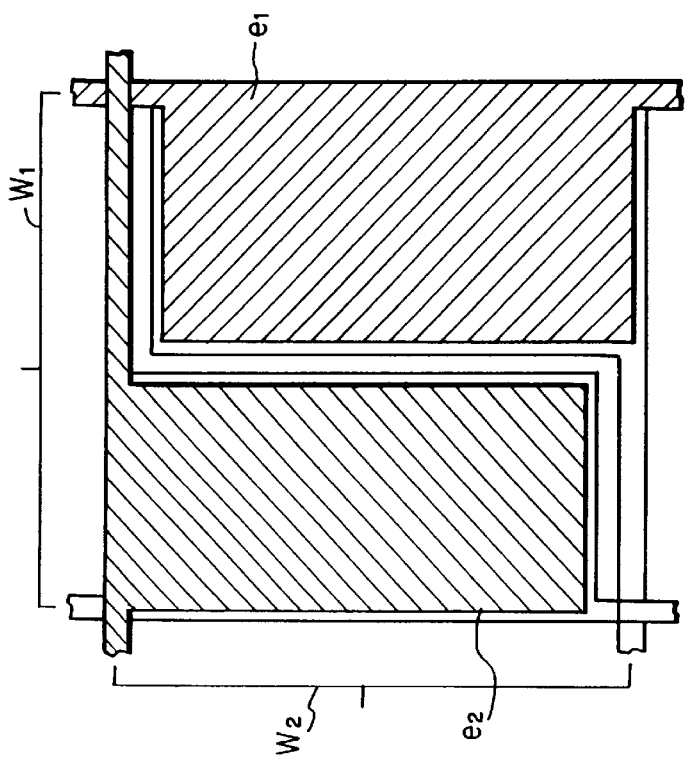
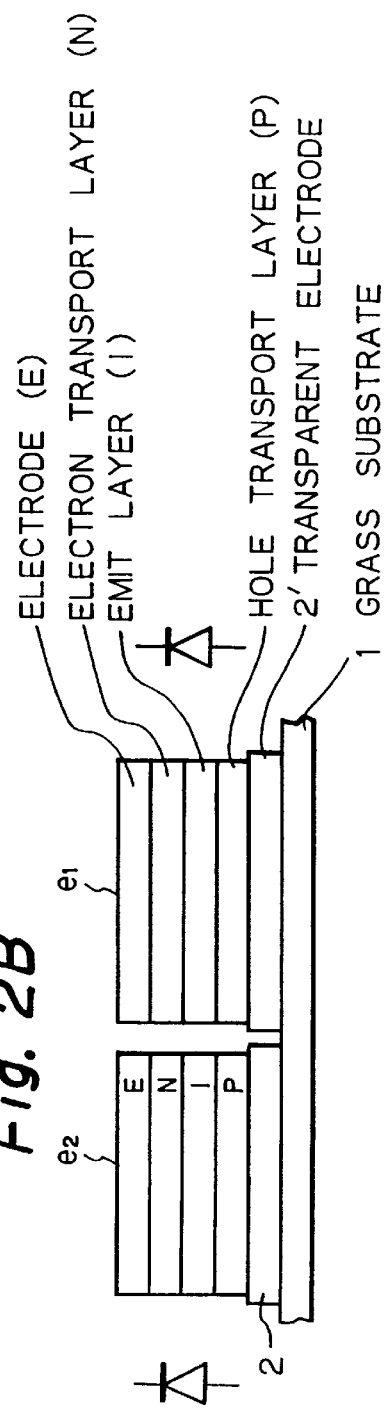
Fig. 2A
Fig. 2B

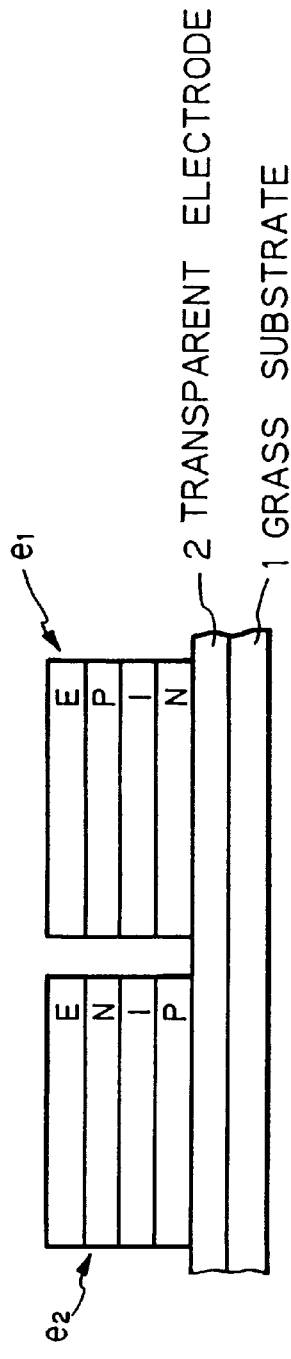
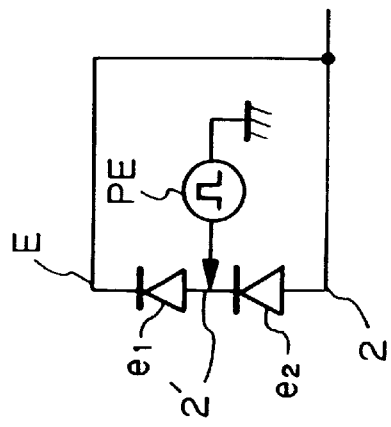
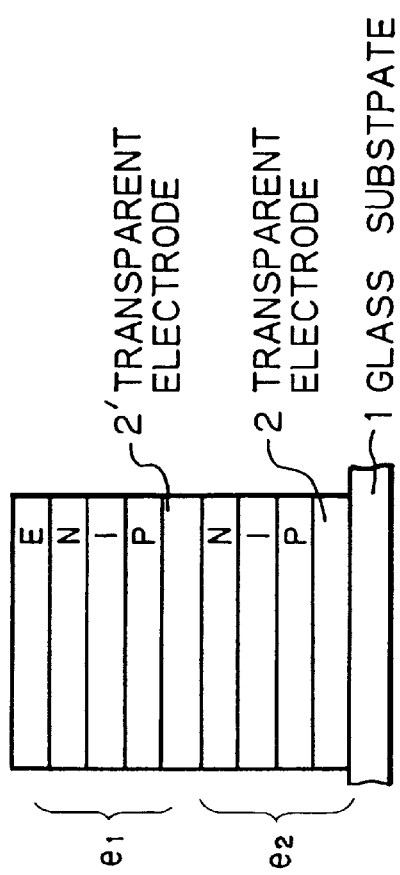
Fig. 3
Fig. 4A
Fig. 4B

ORGANIC ELECTROLUMINESCENT IMAGE DISPLAY DEVICE

FIELD OF THE INVENTION

The present invention relates to an image display system, in particular, relates to such a system which is implemented by using a thin film display cell having rectification characteristics like an organic electro-luminescence (EL) cell, and which may operate without using a TFT (thin film transistor) for switching or lighting each cell.

BACKGROUND OF THE INVENTION

FIG. 6 shows a prior organic electro-luminescence (EL) system which is activated by using a TFT active matrix drive circuit, in which the numeral 10 is a display screen having image cells 10-1, 10-2, 10-3, 10-4, et al, the numeral 15 is a shift register which receives an X-axis signal, and the numeral 16 is a shift register which receives a Y-axis signal. The power supply voltage $E_0$ for operating organic electro-luminescence (EL) is applied to the screen display 10. A picture cell 10-1 has an organic electro luminescence element $EL_1$ which is produced through thin film technique for lighting, a bias TFT (thin film transistor) 11-1 for controlling lighting of said electro-luminescence element $EL_1$, a capacitor $C_1$ coupled with the gate electrode of said bias TFT 11-1, and a Y-axis select switch 12-1 which writes a signal into said capacitor $C_1$. Other picture cells 10-2, 10-3, 10-4 et al are similar to the picture cell 10-1.

The Y-axis select switch 12-1 is made of a TFT (thin film transistor), with a gate electrode coupled with the terminal $Y_1$ of the shift register 16. The Y-axis select switch 12-1 is further coupled with the X-axis select switch 13, which is made of a TFT with a gate electrode coupled with the terminal $X_1$ of the shift register 15. The X-axis select switch 13 receives an image data signal $D_i$.

When a synchronization signal is provided to the terminal $Y_1$ in the Y-axis shift register 16, the Y-axis select switches 12-1, 12-2, et al are turned ON. Simultaneously, when a synchronization signal is provided to the terminal $X_1$ in the X-axis shift register 15, the X-axis select switch 13 is turned ON, and then, an image data signal $D_1$ applied to the X-axis select switch 13 is kept in the capacitor $C_1$ through the Y-axis select switch 12-1.

Next, when a synchronization signal on the terminal $X_1$ is OFF, and it is ON on the terminal $X_2$, the X-axis select switch 13 turned OFF, and the X-axis select switch 14 is turned ON, and an image data signal $D_2$ applied to the X-axis select switch 14 is kept in the capacitor $C_2$ through the Y-axis select switch 12-2. Thus, the Y-axis select switches 12-1, 12-2 et al function as a select switch for storing charge in a capacitor $C_1$, $C_2$, et al depending upon image data signal.

Thus, an image data signal $D_1$, $D_2$, et al is stored in a capacitor $C_1$, $C_2$, et al, respectively, and, a bias TFT (thin film transistor) 11-1, 11-2, et al is turned ON so that an organic EL element $EL_1$, $EL_2$, et al emits light according to an image data signal $D_1$, $D_2$, et al. After the picture cells 10-1, 10-2 et al which relates to the terminal $Y_1$ operate for light emission, the synchronization signal at the terminal $Y_1$ is turned OFF, and the synchronization signal at the terminal $Y_2$ is turned ON so that the picture cells 10-3, 10-4 et al operates for light emission.

Above operation of an EL image display system is shown for instance in I.E.E.E. Trans. Electron Devices, Vol. ED-22, No.9, September, 1975 (pages 739–748).

FIG. 7 shows another prior image display system, which is called Alt-Plesko technique for passive matrix display in which each line or row is activated sequentially one by one.

In FIG. 7, organic EL elements $E_{11}$, $E_{12}$, $E_{21}$, and $E_{22}$ are connected as shown in the figure, the rows $R_1$ (ROW-1) and $R_2$ (ROW-2) are supplied with a pulse voltage V volt or 0 volt through a current restriction resistor R, and columns $C_1$ (Column 1) and $C_2$ (Column 2) are supplied with voltage 0 volt or V volt.

It is assumed that the elements $E_{11}$, $E_{12}$, and $E_{21}$ are bright, and the element $E_{22}$ is dark.

It is supposed at time $t_1$ that the row-1 is supplied with the voltage V, the row $R_2$ is grounded, and the columns $C_1$ and $C_2$ are supplied with the voltage 0 volt, then, the elements $E_{11}$ and $E_{12}$ which are coupled with the row 1 are bright, and the elements $E_{21}$ and $E_{22}$ are dark.

Then, it is supposed at time $t_2$ that the row 1 is grounded, the row 2 is supplied with the voltage V, the column $C_1$ is supplied with the voltage 0, and the column $C_2$ is supplied with the voltage V. Then, the element $E_{21}$ is bright, and the elements $E_{11}$, $E_{12}$ and $E_{22}$ are dark.

If the above operation is repeated quickly with the repetition frequency 60 Hz which a human vision can not follow, it appears that the elements $E_{11}$, $E_{12}$ and $E_{21}$ are bright, and the element $E_{22}$ is dark.

As mentioned above, an organic EL element is selectively activated by supplying the voltage V to each rows sequentially, and supplying the voltage 0 or V to each columns.

The luminance or light intensity of a bright element in that case is the time average of the luminance when it is bright, and the average luminance in FIG. 7 which has two rows is half of the luminance of a cell when it is bright.

However, prior arts in FIGS. 6 and 7 have the disadvantages as follows.

A prior art of FIG. 6 has the disadvantage that each picture cell must be provided with a plurality of TFTs (thin film transistor), and therefore, the total number of TFTs is extravagant. Therefore, when a display screen is large, it is not practical to use a TFT in view of investment and yield rate of production.

A prior art of FIG. 7 has the disadvantage that the average luminance of a bright cell is decreased when a number of rows is large. Therefore, when some average luminance is designed, each cell must emit strong light, which needs high voltage to be applied. Therefore, the maximum number of rows and/or luminance of each cell is restricted by a withstand voltage and/or life time of an image cell.

SUMMARY OF THE INVENTION

The object of the present invention is, therefore, to provide an image display system which overcomes the disadvantages and limitations of a prior image display system.

It is also an object of the present invention to provide an image display system in which an organic electro-luminescence element is activated without using a select switch made of a thin film transistor (TFT).

It is also an object of the present invention to provide an image display system which provides high intensity, and high resolution power, without destroying an organic electro-luminescence element.

The above and other objects are attained by an image display system comprising a plurality of light emitting cells having thin film structure arranged on a planar screen, each light emitting cell having at least a pair of light emitting elements each having rectifying characteristics, and at least two of said light emitting elements being coupled in parallel with each other with opposite polarities so that an anode of a first light emitting element is connected to a cathode of a second light emitting element and a cathode of the first light emitting element is connected to an anode of the second light emitting element.

Preferably, said pixels are located on each cross point of a matrix, which is addressed through an active addressing method in which a plurality of rows are selected simultaneously, and alternate voltage is applied to said matrix.

BRIEF DESCRIPTION OF THE DRAWINGS

The foregoing and other objects, features, and attendant advantages of the present invention will be appreciated as the same become better understood by means of the following description and drawings wherein;

FIGS. 2A and 2B show the structure of an electro-luminescence element according to the present invention, FIG. 3 shows the modification of the structure of an electro-luminescence element according to the present invention, FIG. 4A shows another modification of the structure of an electro-luminescence element according to the present invention, FIG. 4B shows an equivalent circuit of FIG. 4A.

DESCRIPTION OF THE PREFERRED EMBODIMENTS

Figure 1:
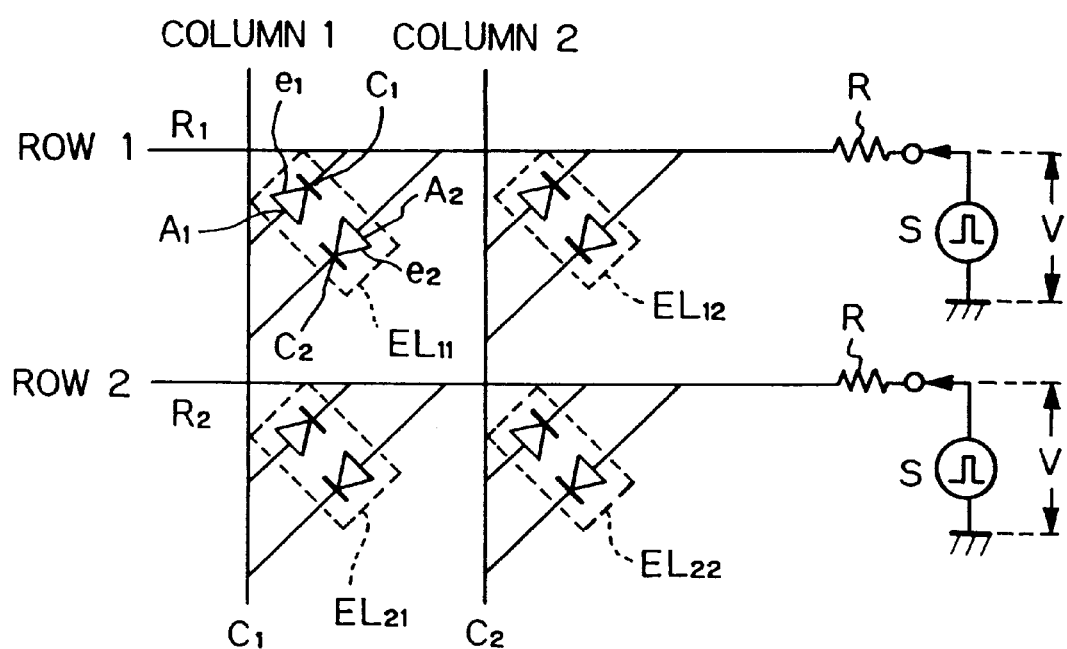
FIG. 1 shows the matrix circuit of the first embodiment of the present invention.

FIG. 1 shows a matrix circuit of the image display system according to the present invention, and FIG. 2 shows the structure of an electro-luminescence element for the use in the matrix in FIG. 1.

FIG. 1 shows a matrix which has a plurality of electro-luminescence cells ($EL_{11}$–$EL_{22}$) on each cross point of a row and a column. Each cell comprises a pair of thin film display elements $e_1$ and $e_2$ coupled in parallel with each other with opposite polarities. In other words, in each cross point, an anode $A_1$ of a first element $e_1$ is connected to a cathode $C_2$ of a second element $e_2$, and a cathode $C_1$ of a first element $e_1$ is connected to an anode $A_2$ of a second element $e_2$.

First, an electro-luminescence cell is described in accordance with FIG. 2. An electro-luminescence element EL according to the present invention comprises a pair of thin film display elements $e_1$ and $e_2$ mounted on a substrate 1 which is made of glass.

A thin film display element $e_1$ comprises a substrate 1 made of glass, a transparent electrode layer 2' deposited on the substrate 1, a hole transport layer P, an emit layer I, an electron transport layer N and an electrode E laminated on said transparent electrode layer 2'. Similarly, a thin film display element $e_2$ comprises a substrate 1 made of glass, a transparent layer 2 deposited on the substrate 1, a hole transport layer P, an emit layer I, an electron transport layer N, and an electrode E laminated on said transparent electrode layer 2. A thin film display element ($e_1$, $e_2$) which has a p-type hole transport layer, and a n-type electron transport layer N, has rectification characteristics. A pair of thin film display elements $e_1$ and $e_2$ each of which has rectification characteristics are coupled in parallel to each other with opposite polarities, by using a pair of lead lines $W_1$ and $W_2$ as shown in FIG. 2A. The lead line $W_1$ connects the electrode layer E of the first element $e_1$ to the transparent electrode 2 of the second element $e_2$, and the lead line $W_2$ connects the electrode layer E of the of the second element $e_2$ to the transparent layer 2' of the first element $e_1$.

The hole transport layer P functions to inject a hole from an electrode layer and transport the same. The electron transport layer N functions to inject an electron from an electrode layer and transport the same. The emit layer I functions to couple a hole and an electron to emit light.

Since a pair of display elements are coupled in parallel with opposite polarities in FIG. 2, the effective area of the element for emitting is decreased to half as compared with the case that full area is used for emitting with no parallel connection. However, in spite of the decrease of the emitting area, FIG. 2 has the advantage that the material of electro-luminescence element, and electrode may be selected with high degree of freedom. The decrease of luminance of an element may be compensated by increasing voltage applied to the element.

Next, the matrix circuit for activating an electro-luminescence element $EL_{11}$–$EL_{22}$ is described in accordance with FIG. 1.

It is assumed that the cells $EL_{11}$, $EL_{12}$ and $EL_{21}$ are bright, and the cell $EL_{22}$ is dark.

First, an Alt-Plesko technique for a passive matrix display is described in which only one row is selected at a time.

At time $t_1$, it is supposed that the first row $R_1$ receives the voltage v through the current restriction resistor R, the second row $R_2$ is grounded, the first column $C_1$ and the second column $C_2$ receive the voltage –a (a is arbitrary voltage), then, the cells $EL_{11}$ and $EL_{12}$ which receive the voltage (v+a) are highly bright, however, the cells $EL_{21}$ and $EL_{22}$ which receive the voltage (a) are weakly bright.

Next, at time $t_2$, it is supposed that the first row $R_1$ is grounded, the second row $R_2$ receives the voltage v through the current restriction resistor R, the first column $C_1$ receives the voltage –a (volt), and the second column $C_2$ receives the voltage a (volt). Then, the cell $EL_{21}$ which receives the voltage (v+a) is highly bright, however, the cells $EL_{11}$ and $EL_{12}$ which receive the voltage a (volt) are weakly bright, and the cell $EL_{22}$ which receives (v–a) (volt) is also weakly bright.

When the period is $t_1+t_2$, the square of the effective voltage applied to the EL cells $EL_{11}$, $EL_{12}$, $EL_{21}$ is; $(v^2+2av+2a^2)/4$, and the square of the effective voltage applied to the EL cell $EL_{22}$ is; $(v^2-2av+2a^2)/4$, as shown in the table 1.

TABLE 1

| Square of effective voltage in Alt-Plesko technique | |
|---|---|
| $EL_{11}$ | $EL_{12}$ |
| $(v^2 + 2av + 2a^2)/4$ | $(v^2 + 2av + 2a^2)/4$ |
| $EL_{21}$ | $EL_{22}$ |
| $(v^2 + 2av + 2a^2)/4$ | $(v^2 - 2av + 2a^2)/4$ |

If the repetition frequency is 60 Hz which a person can not follow, and the voltages v and a are selected so that the enough contrast is obtained between the intensities by the effective voltage which is the square root of $(v^2+2av+2a^2)/4$ and by the effective voltage which is the square root of $(v^2-2av+2a^2)/4$, then, the cells $EL_{11}$, $EL_{12}$ and $EL_{21}$ look bright, and the cell $EL_{22}$ looks dark. The instantaneous maximum voltage applied to the EL cells in this case is (v+a).

Next, an active addressing method in which a plurality of rows are simultaneously selected is described. An active addressing method itself is conventional, as is described for instance in Nikkei Electronics, 1994/09/26, pages 179–191.

It is assumed that the cells $EL_{11}$, $EL_{12}$ and $EL_{21}$ are bright, and the $EL_{22}$ is dark.

In an active addressing method, a plurality of rows (2 rows in the embodiment of FIG. 1) are selected simultaneously through a current restriction resistor R, and a voltage is applied to each column depending upon whether each cell is bright or dark.

At time $t_1$, it is supposed that the rows $R_1$ and $R_2$ receive the voltage v from the pulse power source S through the current restriction resistor R, the column $C_1$ receives the voltage $-2a$, and the column $C_2$ receives the voltage zero. Then, the cells $EL_{11}$ and $EL_{21}$ are strongly bright, and the cells $EL_{12}$ and $EL_{22}$ are weakly bright.

Next, at time $t_2$, it is supposed that the row $R_1$ receives the voltage v from the pulse power source S through the current restriction resistor R, the row $R_2$ receives the voltage $-v$, the column $C_1$ receives the voltage zero, and the column $C_2$ receives the voltage $-2a$. Then, the cells $EL_{12}$ is strongly bright, however, the cells $EL_{11}$, $EL_{21}$ and $EL_{22}$ are weakly bright.

When the period is $t_1+t_2$, the square of the effective voltage applied to the cells $EL_{11}$, $EL_{12}$ and $EL_{21}$ is; $2(v^2+2av+2a^2)/4$, and the square of the effective voltage applied to the cell $EL_{22}$ is $2(v^2-2av+2a^2)/4$, as shown in the table 2.

TABLE 2

Square of effective voltage in active addressing method

| $EL_{11}$ | $EL_{12}$ |
|---|---|
| $2(v^2 + 2av + 2a^2)/4$ | $2(v^2 + 2av = 2a^2)/4$ |
| $EL_{21}$ | $EL_{22}$ |
| $2(v^2 + 2av + 2a^2)/4$ | $2(v^2 - 2av + 2a^2)/4$ |

If the repetition frequency is 60 Hz which a person can not follow, and the values v and a are selected so that the luminance by the voltage of the square root of $(v^2+2av+2a^2)/4$ and the luminance by the voltage of the square root of $(v^2-2av+2a^2)/4$ have the enough contrast with each other, it looks that the cells $EL_{11}$, $EL_{12}$ and $EL_{21}$ are bright, and the cell $EL_{22}$ is dark.

It should be noted that if the value v is $(1/\sqrt{2})v$, and $-2a$ is $-\sqrt{2}$ a in the table 2, the effective voltage in the table 2 is the same as the effective voltage in the table 1.

The reason why two elements $e_1$ and $e_2$ are coupled in parallel with opposite polarity, and an active addressing method is used, is now described.

When a line buffer memory is used in Alt-Plesko technique, and the luminance of a cell is X cd/m², the required maximum luminance $L_{max}$ cd/m² in each field when there are N number of rows in a screen is;

$$L_{max} = X \times N$$

It should be noted that each cell is selected only the duration of 1/N of the repetition period, and therefore, the luminance or light intensity when it is selected must be N times as bright as the required average luminance.

In a numerical embodiment, when the required average luminance is 150 cd/m², and the number of rows (scanning lines) is 640, the maximum luminance in each cell is;

$$L_{max} = 150 \times 640 = 96000 \ cd/m^2$$

Figure 7:
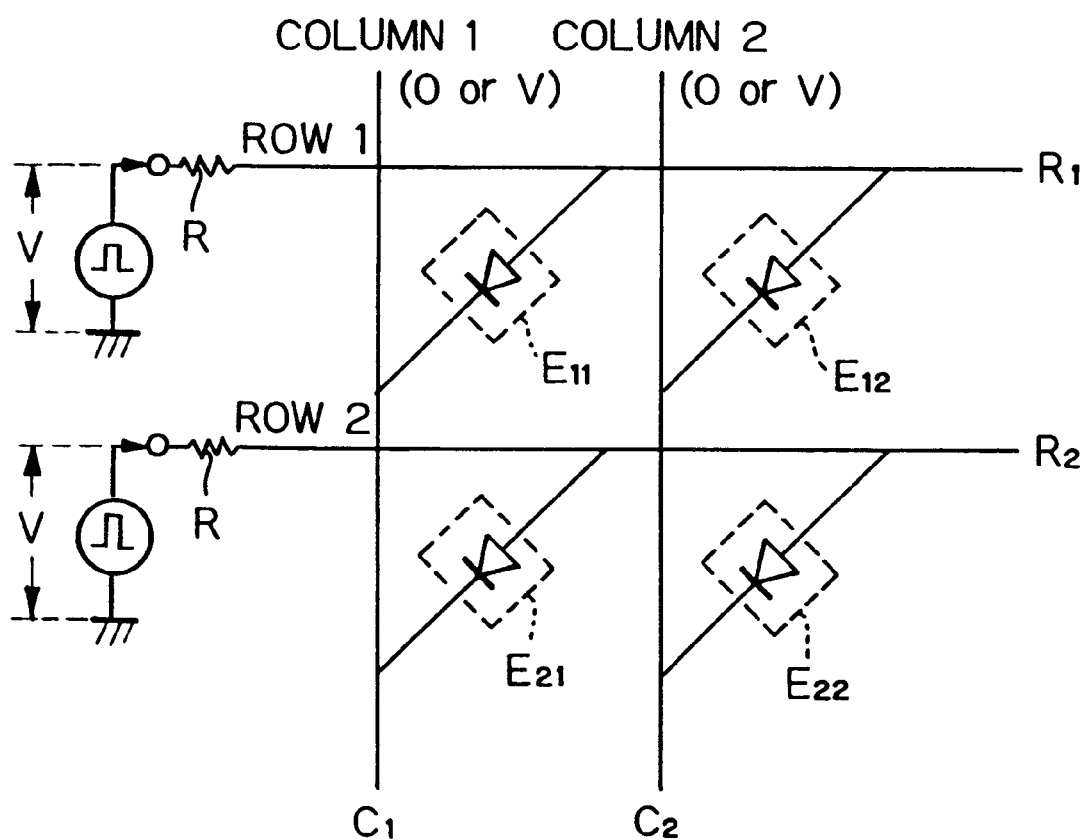
FIG. 7 is a prior drive circuit in an Alt-Plesko technique for passive matrix display.

In FIG. 7 in which number of rows is two, assuming that the voltage applied to each row through a current restriction resistor R is 5 volts, the average luminance of each cell is only the luminance which is obtained by applying 2.5 volt to a cell.

The same average luminance as that is obtained in the circuit of FIG. 1 which is activated through Alt-Plesko technique with v=3 (volt), and a=1 (volt). In that case, the cells $EL_{11}$, $EL_{12}$ and $EL_{21}$ receive 4 volt (3+1=4).

Further, the same average luminance as that is obtained in the circuit of FIG. 1 which is activated through active addressing method with v=2.1 (volt), and a=1.4 (volt). In that case, the cells $EL_{11}$, $EL_{12}$, and $EL_{21}$ receive 3.5 volt (=2.1+1.4).

As described above, the voltage v applied to a cell in FIG. 1 is lower than that in FIG. 7, and further, it is lower when active addressing method is used, than that when Alt-Plesko technique is used.

The above embodiment is described when N=2 (there are two rows). It should be appreciated of course that said advantage of lower voltage v for the same average luminance is obtained for any number of rows (N).

When an Alt-Plesko technique is used in accordance with a circuit in FIG. 1, an effective voltage $E_{on}$ applied to a bright cell is expressed as follows.

$$E_{on} = \sqrt{v^2 + 2av + Na^2} \times (1/N) \tag{1}$$

where v is absolute value of voltage applied to a row (scanning line), (a) is absolute value of voltage applied to a column (data line), and N is number of rows (number of scanning lines).

On the other hand, in case of FIG. 7 (prior art) which is activated through Alt-Plesko technique, the effective voltage is V/N, where V is the output voltage of a pulse power source. Since N>1 is satisfied, V>(v+a) is satisfied from the equation (2) by assuming that two effective voltages are equal to each other. It should be noted that the voltage (v+a) is the instantaneous maximum voltage when Alt-Plesko technique is used in the circuit of FIG. 1. Thus, the voltage (v+a) applied to a cell in FIG. 1 which is activated through Alt-Plesko technique is lower than V applied to a cell in FIG. 7, assuming that average luminance in FIG. 1 is the same as that in FIG. 7.

Next, the requested voltage in case of active addressing method is described.

As mentioned before, when all the rows are selected simultaneously in active addressing method, if v is designed so that it is equal to $(1/\sqrt{N})v$, and a is designed so that it is equal to $\sqrt{N}$ a, the effective voltage in active addressing method is the same as the effective voltage in Alt-Plesko technique. Therefore, if v and a are selected so that $v > \sqrt{N}$ a, then the following equation is satisfied.

$$(v + a) > (1/\sqrt{N}) \times V + \sqrt{N} \times (a)$$

Therefore, the instantaneous maximum voltage in active addressing method is lower than that in Alt-Plesko technique. It should be noted that an active addressing method activates an image cell with alternate (AC) voltage, therefore, it can not activate an EL (electro-luminescence) cell which has rectification characteristics.

The present invention has solved that problem by coupling a pair of EL elements in parallel with opposite polarities, so that when voltage supplied to the elements is positive a first element emits light, and when the voltage is negative another element emits light. However, if the structure of FIG. 2 is used, the useful area for emitting at a time is half, the luminance must be twice so that the decrease of the area is compensated.

FIG. 3 shows another embodiment of an EL cell according to the present invention. In FIG. 3, the numeral 1 is a substrate made of glass, on which a transparent electrode layer 2 is deposited. The first EL element $e_1$ having an electron transport layer N, an emit layer I, a hole transport layer P, and an electrode layer E is placed on the transparent electrode layer 2 so that the electron transport layer N is contacted with the transparent electrode layer 2. The second EL element $e_2$ which has the same structure as that of the first EL element $e_1$ is placed on the transparent electrode layer 2 so that the hole transport layer P is contacted with the transparent electrode layer 2.

The structure of FIG. 3 has the advantage that the parallel connection of two elements $e_1$ and $e_2$ with opposite polarities is simply obtained.

The EL cell in FIG. 3 may be activated through either Alt-Plesko technique or active addressing method.

FIG. 4A shows still another embodiment of an EL cell according to the present invention. The feature of FIG. 4A is that a pair of EL elements $e_1$ and $e_2$ are laminated on a substrate 1. In FIG. 4A, the second EL element $e_2$ is placed on the substrate 1, and the first EL element $e_1$ is placed on the second EL element $e_2$. In that case, the transparent electrode 2' of the first EL element $e_1$ doubles as an electrode of the second EL element $e_2$. The light emitted by the structure of FIG. 4A is output through the substrate 1 which is made of transparent glass.

FIG. 4B shows an equivalent circuit of FIG. 4A. The electrode E of the first EL element $e_1$ is connected to the transparent electrode layer 2 of the second EL element $e_2$, so that two EL elements $e_1$ and $e_2$ are connected in parallel with opposite polarities. A pulse power supply PE is applied between the intermediate transparent electrode layer 2', and the electrode E.

A drive circuit for the structure of FIG. 4A is an active drive circuit.

The structure of FIG. 4A has the advantage that the effective emit area of an EL element is not decreased in spite of the use of a pair of EL elements coupled in parallel with opposite polarities, because a pair of EL elements are laminated but not placed on a plane. Therefore, in the structure of FIG. 4A, the supply voltage may be lower than the case in FIG. 2 and FIG. 3.

Further, the structure of FIG. 4A has the advantage that high density of EL panel is obtained since each light element may be small in size.

The above embodiments has been described for the matrix with the size of 2×2.

Figure 5:
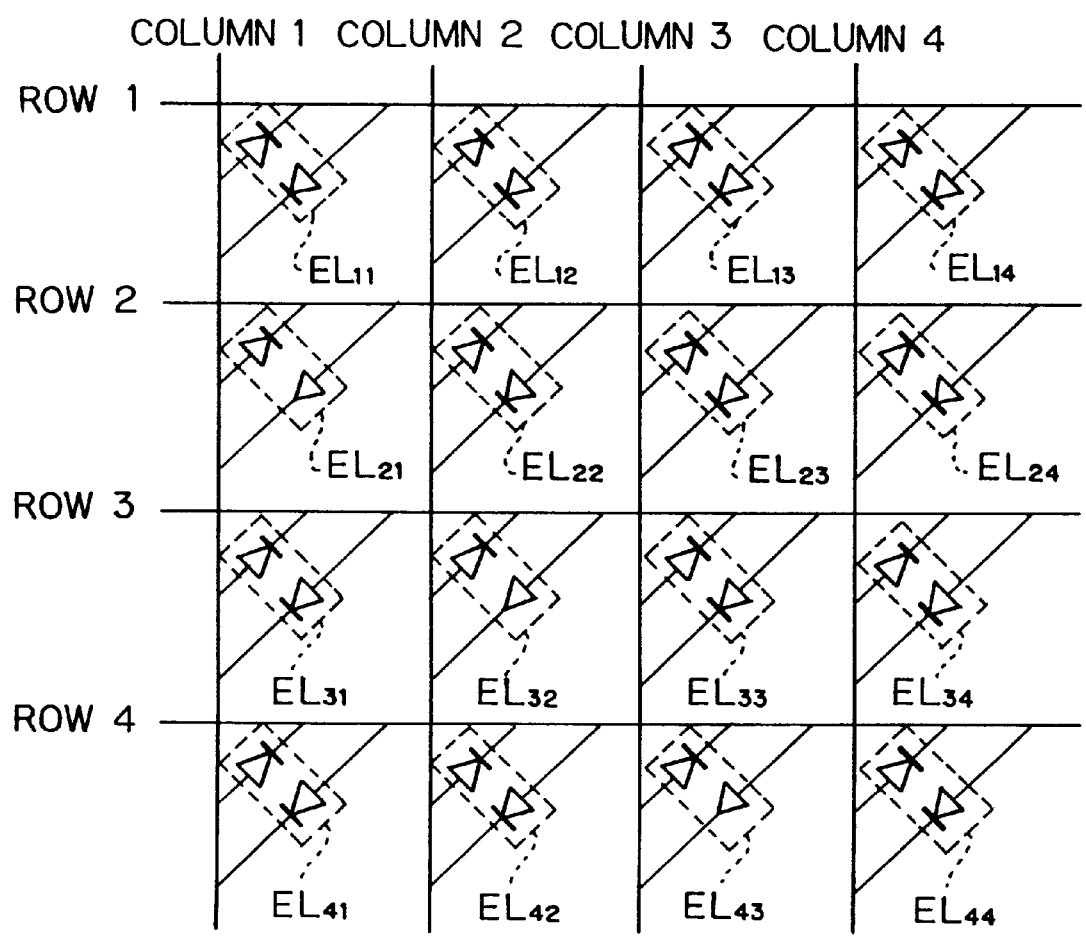
FIG. 5 shows the matrix circuit of another embodiment according to the present invention.
Figure 6:
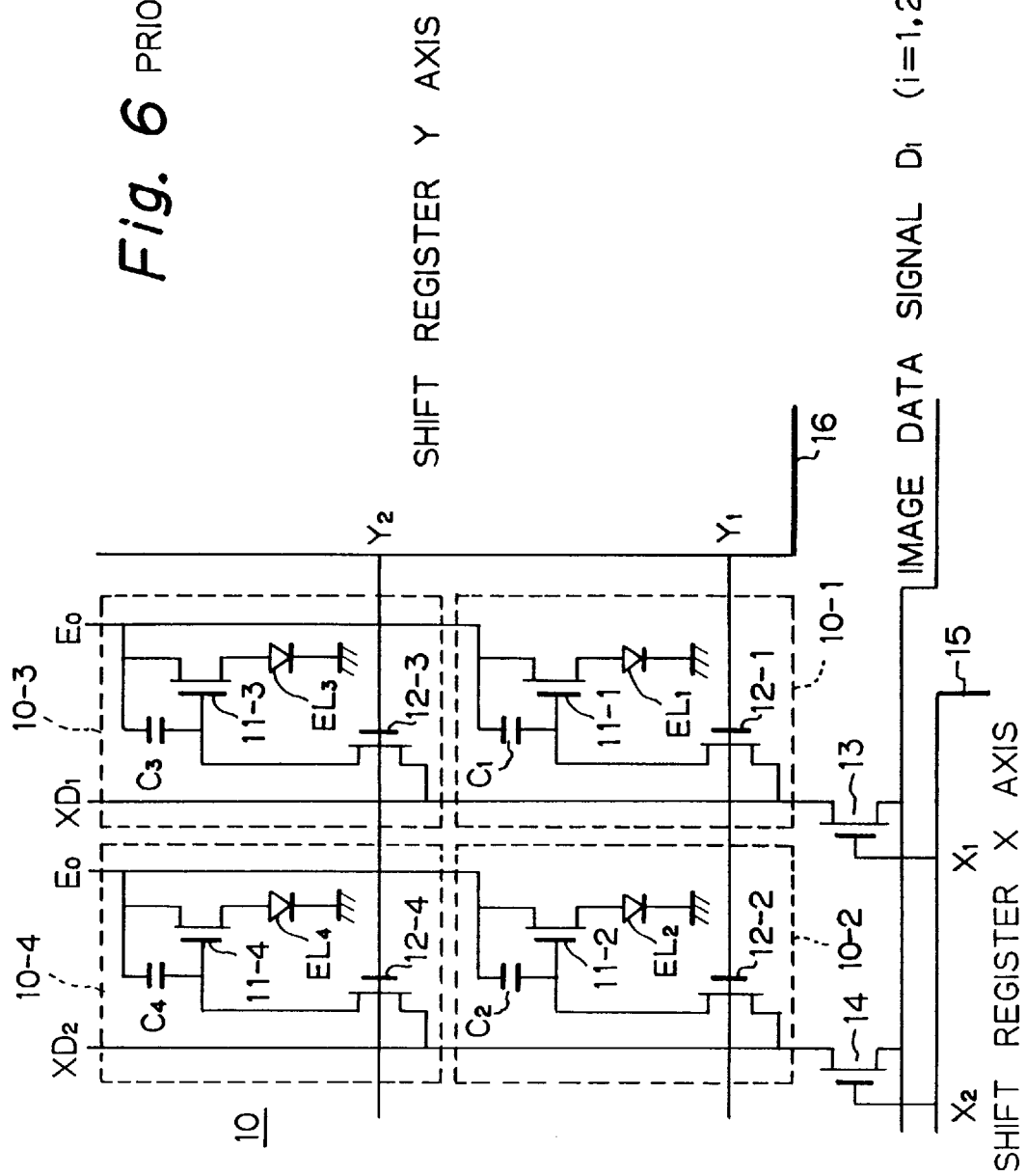
FIG. 6 shows a drive circuit for a TFT active matrix in a prior art.

FIG. 5 shows the embodiment of the matrix with the size of 4×4 which is driven through an active addressing method.

It is assumed that the image for the embodiment of FIG. 5 is bright in the first row, and the third row, and dark in the second row and the fourth row, as shown in the table 3 where −1 shows bright, and 0 shows dark.

TABLE 3

| Image to be displayed | | | |
|---|---|---|---|
| −1, | −1, | −1, | −1 |
| 0, | 0, | 0, | 0 |
| −1, | −1, | −1, | −1 |
| 0, | 0, | 0, | 0 |

The voltage and data value supplied to the rows and the columns in that case is shown in the table 4.

TABLE 4

| Voltage supplied to the rows and the columns | | | | |
|---|---|---|---|---|
| | $t_1$ | $t_2$ | $t_3$ | $t_4$ |
| Row 1 | v | v | v | v |
| Row 2 | v | −v | v | −v |
| Row 3 | v | v | −v | −v |
| Row 4 | v | −v | −v | v |
| Column 1 | −2a | −2a | 0 | 0 |
| Column 2 | −2a | −2a | 0 | 0 |
| Column 3 | −2a | −2a | 0 | 0 |
| Column 4 | −2a | −2a | 0 | 0 |

At time $t_1$, all the rows 1–4 receive the voltage v, and all the columns 1–4 receive the voltage −2a, so that all the EL elements $EL_{11}$–$EL_{44}$ are bright.

At time $t_2$, the rows 1 and 3 receive the voltage v, the rows 2 and 4 receive the voltage −v, and all the columns 1–4 receive the voltage −2a, so that the EL elements $EL_{11}$–$EL_{14}$ in the first row and the EL elements $EL_{31}$–$EL_{34}$ in the third row are strongly bright, but the EL elements $EL_{21}$–$EL_{24}$ and the EL elements $EL_{41}$–$EL_{44}$ are weakly bright.

At time $t_3$, the rows 1 and 2 receive the voltage v, the rows 3 and 4 receive the voltage −v, and all the columns 1–4 receive the voltage 0, so that all the EL elements $EL_{11}$–$EL_{44}$ are weakly bright.

At time $t_4$, the rows 1 and 4 receive the voltage v, the rows 2 and 3 receive the voltage −v, and all the columns 1–4 receive the voltage 0, so that all the EL elements $EL_{11}$–$EL_{44}$ are weakly bright.

Thus, the image which is bright in the first row and the third row, and dark in the second row and the fourth row is displayed.

It should be appreciated of course that the size of matrix in the present invention is not restricted to 2×2, or 4×4, but any size of matrix is possible.

An active addressing method is conventional in a liquid crystal display (LCD), as shown in Nikken Electronics, Sep. 26, 1994 (pages 179–191). The voltage which should be applied to a row and a column (table 4) is obtained through the multiplication of an image data matrix (table 3) and an Hadamard matrix.

As described above in detail, according to the present invention, a large bright screen is obtained by using an organic EL element without using a thin film transistor (TFT) for addressing, and voltage applied to an element is not high as compared with that of a prior art. Therefore, life time of an EL element may be long.

From the foregoing, it will now be apparent that a new and improved image display system has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. An image display system comprising:

a plurality of light emitting cells having thin film structure arranged on a planar screen, wherein each light emitting cell has at least a pair of light emitting elements each having the same rectifying characteristics, and wherein at least two of said light emitting elements are coupled in parallel with each other with opposite polarities so that an anode of a first light emitting element is connected to a cathode of a second light emitting element and a cathode of the first light emitting element is connected to an anode of the second light emitting element, and wherein said cells are located on each cross point of a matrix, which is addressed through an active addressing method in which a plurality of rows are selected simultaneously, and alternate voltage is applied to said matrix.

2. An image display system according to claim 1, wherein said light emitting elements in a cell are located on a plane.

3. An image display system according to claim 1, wherein said light emitting elements in a cell are laminated.

4. An image display system according to claim 3, wherein a common transparent electrode is sandwiched between two light emitting elements.

5. An image display system according to claim 1, wherein said light emitting element is an organic electroluminescence element.

* * * * *

UNITED STATES PATENT AND TRADEMARK OFFICE
CERTIFICATE OF CORRECTION

PATENT NO. : 5,982,345

DATED : November 9, 1999

INVENTOR(S) : Takayama et al.

It is certified that error appears in the above-identified patent and that said Letters Patent is hereby corrected as shown below:

Title page,
Item [73] please delete "TDK Corporation, Kanagawa, Japan"

and insert therefor, -- TDK Corporation, Tokyo, Japan and

SEMICONDUCTOR ENERGY LABORATORY CO., LTD., Kanagawa, Japan --

Signed and Sealed this

Twenty-second Day of May, 2001

Attest:

NICHOLAS P. GODICI

Attesting Officer

*Acting Director of the United States Patent and Trademark Office*